United States Patent
Tsuruga

(10) Patent No.: US 11,774,509 B2
(45) Date of Patent: Oct. 3, 2023

(54) MANAGEMENT DEVICE, VEHICLE MANAGEMENT SYSTEM, VEHICLE MANAGEMENT METHOD, AND RECORDING MEDIUM IN WHICH PROGRAM IS RECORDED

(71) Applicant: TOYOTA JIDOSHA KABUSHIKI KAISHA, Toyota (JP)

(72) Inventor: Masahiro Tsuruga, Tajimi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 36 days.

(21) Appl. No.: 17/579,748

(22) Filed: Jan. 20, 2022

(65) Prior Publication Data
US 2022/0283238 A1 Sep. 8, 2022

(30) Foreign Application Priority Data
Mar. 5, 2021 (JP) .................. 2021-035647

(51) Int. Cl.
| | |
|---|---|
| *G01R 31/00* | (2006.01) |
| *G01R 31/3842* | (2019.01) |
| *B60R 16/02* | (2006.01) |
| *H01M 10/42* | (2006.01) |
| *H01M 10/48* | (2006.01) |
| *G01R 31/396* | (2019.01) |

(52) U.S. Cl.
CPC .......... *G01R 31/3842* (2019.01); *B60R 16/02* (2013.01); *G01R 31/396* (2019.01); *H01M 10/425* (2013.01); *H01M 10/48* (2013.01); *H01M 10/482* (2013.01); *H01M 2220/20* (2013.01)

(58) Field of Classification Search
CPC ............................ G01R 31/00; G01R 31/3842
USPC .......... 324/426, 432–435, 150; 320/136, 162
See application file for complete search history.

(56) References Cited

U.S. PATENT DOCUMENTS

| | | | |
|---|---|---|---|
| 2003/0015995 A1* | 1/2003 | Tamura | H02J 7/0014 320/162 |
| 2015/0054467 A1* | 2/2015 | Takano | H02J 7/0047 320/136 |
| 2018/0074127 A1 | 3/2018 | Mizoguchi | |

FOREIGN PATENT DOCUMENTS

JP  2018-44795 A  3/2018

* cited by examiner

*Primary Examiner* — Vincent Q Nguyen
(74) *Attorney, Agent, or Firm* — Oblon, McClelland, Maier & Neustadt, L.L.P.

(57) ABSTRACT

A battery management device of a vehicle management system is installed at a vehicle and provided in a battery pack that houses a battery, the battery management device including a voltage sensor that detects a voltage value of the battery; a current sensor that detects a current value of the battery; and a battery monitoring integrated circuit that is communicably connected to the voltage sensor and the current sensor and outputs, to a battery control device, a signal representing the voltage value acquired from the voltage sensor and a signal representing the current value acquired from the current sensor.

9 Claims, 4 Drawing Sheets

MANAGEMENT DEVICE, VEHICLE MANAGEMENT SYSTEM, VEHICLE MANAGEMENT METHOD, AND RECORDING MEDIUM IN WHICH PROGRAM IS RECORDED

CROSS-REFERENCE TO RELATED APPLICATION

This application is based on and claims priority under 35 USC 119 from Japanese Patent Application No. 2021-035647 filed on Mar. 5, 2021, the disclosure of which is incorporated by reference herein.

BACKGROUND

Technical Field

The present disclosure relates to a management device, a vehicle management system, a vehicle management method, and a recording medium in which a program is recorded.

Related Art

A device that controls a battery can more reliably control the battery when it is given a redundant configuration. However, when microcomputers pertaining to control of the battery are all made redundant, the number of the microcomputers increases and the device becomes complicated, leading to an increase in cost. Therefore, it is conceivable to separate the detection unit that detects the state quantity of the battery and the control unit that controls the battery and provide a microcomputer in just the control unit. For example, Japanese Patent Application Laid-open (JP-A) No. 2018-44795 discloses a battery diagnostic device that includes plural detection units that detect the voltages of plural battery blocks and one control unit that controls the plural detection units.

When measuring internal resistance, it is necessary to acquire the current at the same timing as the voltage. When acquiring the current with an integrated circuit separate from the voltage sensor, there arises the need to synchronize the timings when the voltage and the current are acquired so that a time lag does not arise.

SUMMARY

It is an object of the present disclosure to provide a management device, a vehicle management system, a vehicle management method, and a recording medium in which a program is recorded, which can acquire the voltage value and the current value of a battery with one integrated circuit.

A first aspect is a management device that is installed at a vehicle, is provided in a casing that houses a battery, and manages the battery, the management device including: a voltage sensor that detects a voltage value of the battery; a current sensor that detects a current value of the battery; and an integrated circuit that is communicably connected to the voltage sensor and the current sensor and outputs, to an external control device, a signal representing the voltage value acquired from the voltage sensor and a signal representing the current value acquired from the current sensor.

In the management device of the first aspect, the voltage sensor detects the voltage value of the battery. The current sensor detects the current value of the battery. The integrated circuit outputs, to the external control device, the signal representing the voltage value acquired from the voltage sensor and the signal representing the current value acquired from the current sensor. Because of this, the voltage value and the current value of the battery can be acquired with one integrated circuit. It will be noted that "communicably connected to the voltage sensor and the current sensor" means that the integrated circuit is directly or indirectly connected to the voltage sensor and the current sensor.

A management device of a second aspect is the management device of the first aspect, further including a storage unit that is communicably connected to the integrated circuit and stores information relating to the battery, wherein the storage unit is communicably connected via the integrated circuit to the external control device. Because of this, the information relating to the battery stored in the storage unit can also be acquired with one integrated circuit. It will be noted that the information relating to the battery includes information relating to the type of the battery or information relating to the condition of deterioration of the battery.

A management device of a third aspect is the management device of the second aspect, further including a multiplexer that is connected to the current sensor, the storage unit, and the integrated circuit and can switch an object that can communicate with the integrated circuit to either the current sensor or the storage unit, wherein the multiplexer switches the object that can communicate with the integrated circuit to the current sensor in a case in which an ignition switch of the vehicle is switched on, and switches the object that can communicate with the integrated circuit to the storage unit in a case in which the ignition switch of the vehicle is switched off. Because of this, the voltage value and the current value of the battery and the information relating to the battery stored in the storage unit can be acquired while reducing the number of communication lines connected to the integrated circuit.

A fourth aspect is a vehicle management system including the management device of the third aspect and the external control device, wherein the external control device detects a state of the multiplexer based on a signal that is output via the multiplexer and the integrated circuit in a case in which the ignition switch of the vehicle is switched on. Because of this, whether the state of the multiplexer is faulty or normal can be detected. It will be noted that "state of the multiplexer" includes the multiplexer being faulty.

A fifth aspect is a vehicle management system including the management device of the third aspect and the external control device, wherein the external control device switches a speed of communication with the management device between a time at which the external control device reads the information from the storage unit via the integrated circuit and the multiplexer and a time at which the external control device acquires the current value from the current sensor via the integrated circuit and the multiplexer. Because of this, even when the communication speed when reading the information from the storage unit and the communication speed when acquiring the current value from the current sensor are different, this can be handled.

A sixth aspect is a vehicle management system including the management device of any one of the first aspect to the third aspect and the external control device, wherein the battery includes plural cells, and the external control device sequentially performs acquisition of voltage values of some of the cells from the voltage sensor, acquisition of the current value from the current sensor, and acquisition of the voltage values of the remaining cells from the voltage sensor to determine the state of the battery in each cell. Because of this, differences between the timing of the acquisition of the voltage value and the timing of the acquisition of the current value can be reduced so that the state of the battery in each cell can be accurately determined. It will be noted that "state of the battery" includes the battery being faulty.

A seventh aspect is a vehicle management method in a vehicle management system including the management device of the third aspect and the external control device, wherein the external control device detects the state of the multiplexer based on the signal that is output via the multiplexer and the integrated circuit in a case in which the ignition switch of the vehicle is switched on. Because of this, whether the state of the multiplexer is faulty or normal can be detected.

An eighth aspect is a vehicle management method in a vehicle management system including the management device of the third aspect and the external control device, wherein the external control device switches a speed of communication with the management device between a time at which the external control device reads the information from the storage unit via the integrated circuit and the multiplexer and a time at which the external control device acquires the current value from the current sensor via the integrated circuit and the multiplexer. Because of this, even when the communication speed when reading the information from the storage unit and the communication speed when acquiring the current value from the current sensor are different, this can be handled.

A ninth aspect is a vehicle management method in a vehicle management system including the management device of any one of the first aspect to the third aspect and the external control device, with the battery including plural cells, wherein the external control device sequentially performs acquisition of voltage values of some of the cells from the voltage sensor, acquisition of current values from the current sensor, and acquisition of voltage values of the remaining cells from the voltage sensor to determine the state of the battery in each cell. Because of this, differences between the timing of the acquisition of the voltage value and the timing of the acquisition of the current value can be reduced so that the state of the battery in each cell can be accurately determined.

A tenth aspect is a non-transitory recording medium in which is recorded a program causing a computer to function as the external control device in the vehicle management system of any one of the fourth aspect to the sixth aspect.

According to the present disclosure, the voltage value and the current value of the battery can be acquired with one integrated circuit.

BRIEF DESCRIPTION OF THE DRAWINGS

An exemplary embodiment of the present disclosure will be described in detail based on the following figures, wherein:

FIG. 3 is a flowchart showing a process when an ignition switch pertaining to the embodiment of the disclosure is switched on.

DETAILED DESCRIPTION

A vehicle management system of this disclosure can, as an example, be installed in a vehicle that employs a power supply system having a redundant configuration and which is capable of switching between manual driving and autonomous driving. Below, an embodiment of the disclosure will be described in detail with reference to the drawings taking as an example a case where the vehicle management system is installed in a vehicle capable of switching between manual driving and autonomous driving.

Embodiment

[Configuration]

Figure 1:
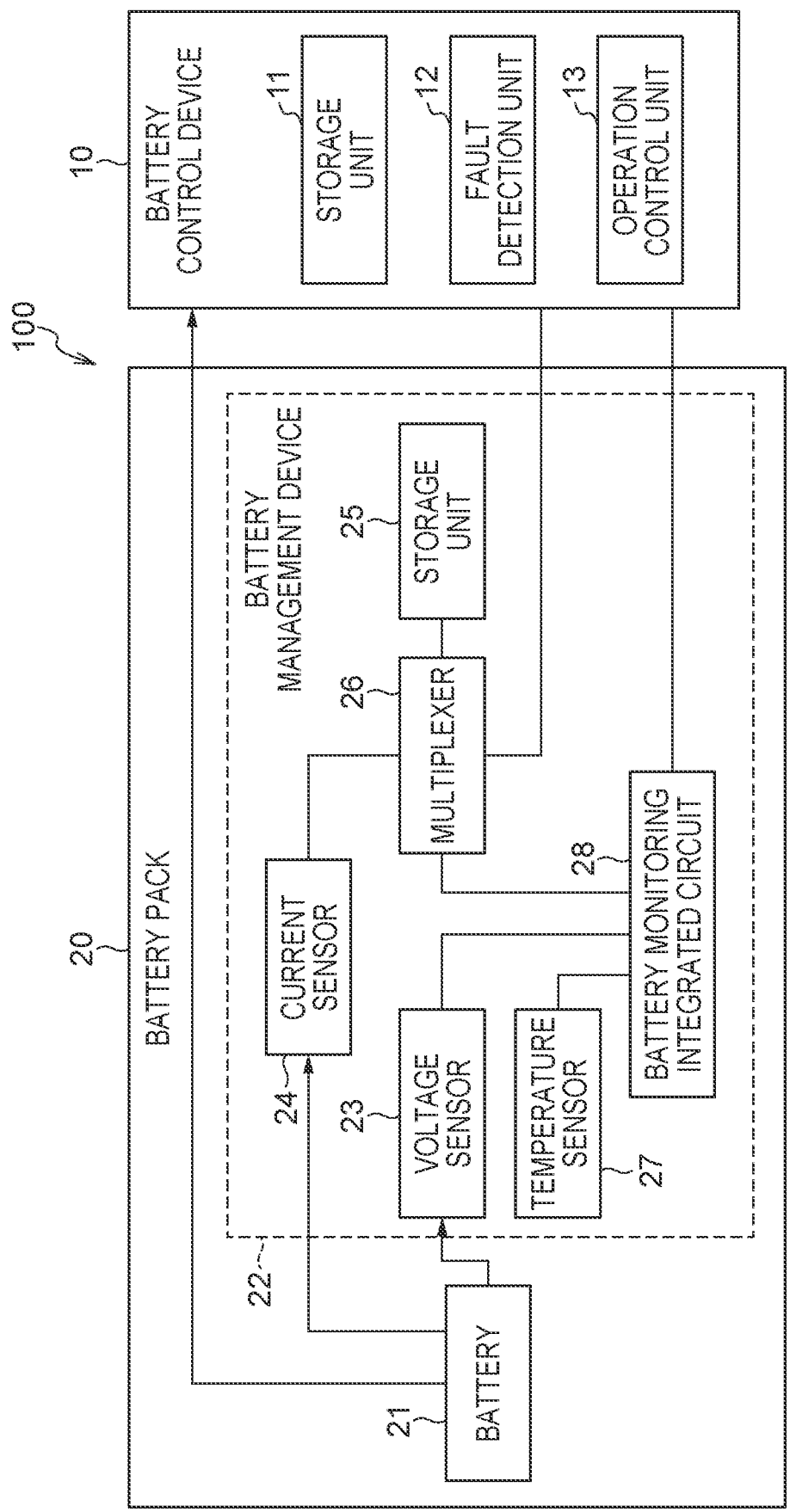
FIG. 1 is a diagram showing an example configuration of a vehicle management system pertaining to the embodiment of the disclosure.

FIG. 1 is a functional block diagram of a vehicle management system 100 pertaining to an embodiment of the disclosure. The vehicle management system 100 includes a battery control device 10 and a battery pack 20. The battery pack 20 is communicably connected to the battery control device 10 via an in-vehicle network such as a controller area network (CAN) and is controlled by the battery control device 10.

(1) Battery Pack

The battery pack 20 is a casing that houses a battery 21, and the battery pack 20 is connected to the battery control device 10 in such a way as to be replaceable. The battery pack 20 includes the battery 21 and a battery management device 22. The battery management device 22 includes a voltage sensor 23, a current sensor 24, a storage unit 25, a multiplexer 26, a temperature sensor 27, and a battery monitoring integrated circuit (IC) 28.

The battery 21 is a secondary battery configured to be rechargeable, such as a lead storage battery or a lithium-ion battery. The battery 21 can supply the power it stores to devices (not shown in the drawings) such as electronic devices called electronic control units (ECUs) and electrical components based on control by the battery control device 10. When the battery 21 is applied to a vehicle capable of switching between manual driving and autonomous driving, the battery 21 can be used as a sub-battery that backs up a main battery in autonomous driving.

The voltage sensor 23 detects the voltage value of the battery 21. The battery 21 has plural cells, and the voltage sensor 23 detects the voltage value of each cell of the battery 21.

The current sensor 24 detects the current value of the battery 21.

The storage unit 25 stores, as information relating to the battery 21 built into the same battery pack 20, for example, identification information and ignition-on (IG-ON) total time. For the storage unit 25, a non-volatile memory such as an electrically erasable programmable read-only memory (EEPROM) can be used.

The identification information is information with which the type of the battery 21 can be identified, and is a unique value applied beforehand in accordance with the type of the battery 21. The identification information is stored in the storage unit 25 in association with the battery 21 built in the battery pack 20 at the time of manufacture of the battery pack 20, for example. For the identification information, for example, an identifying ID can be used.

The IG-ON total time is information in which is cumulatively counted the time in which the ignition is on, which is the time in which the power supply system of the vehicle has operated, during the time period from when the battery pack 20 having the built-in battery 21 was installed in the vehicle to the present time. The total time is updated to a new value at the timing when the ignition is switched off (IG-OFF) when the power supply system stops.

The multiplexer 26 is a circuit that is connected to the current sensor 24, the storage unit 25, and the battery monitoring integrated circuit 28 and can switch the object that can communicate with the battery monitoring integrated circuit 28 to either one of the current sensor 24 and the storage unit 25. The multiplexer 26 switches the object that can communicate with the battery monitoring integrated circuit 28 to either one of the current sensor 24 and the storage unit 25 under control by the battery control device 10.

The temperature sensor 27 detects the temperature of the battery 21. The battery 21 has plural cells, and the temperature sensor 27 detects the temperature of each cell of the battery 21.

The battery monitoring integrated circuit 28 acquires the state (voltage value, current value, and temperature, etc.) of the battery 21. The battery monitoring integrated circuit 28 acquires a signal representing the current value of the battery 21 via the multiplexer 26. Furthermore, the battery monitoring integrated circuit 28 can read the identification information and the IG-ON total time from the storage unit 25 via the multiplexer 26 and update the IG-ON total time that the storage unit 25 stores. Furthermore, the battery monitoring integrated circuit 28 typically is configured as a circuit in which are integrated the functions of an acquisition unit that acquires the voltage value, the current value, and the temperature of the battery 21 that the various sensors detect and a communication unit that communicates with the battery control device 10 via a communication port. The state of the battery 21, the identification information, and the IG-ON total time are sent from the battery monitoring integrated circuit 28 to the battery control device 10.

(2) Battery Control Device

Figure 2:
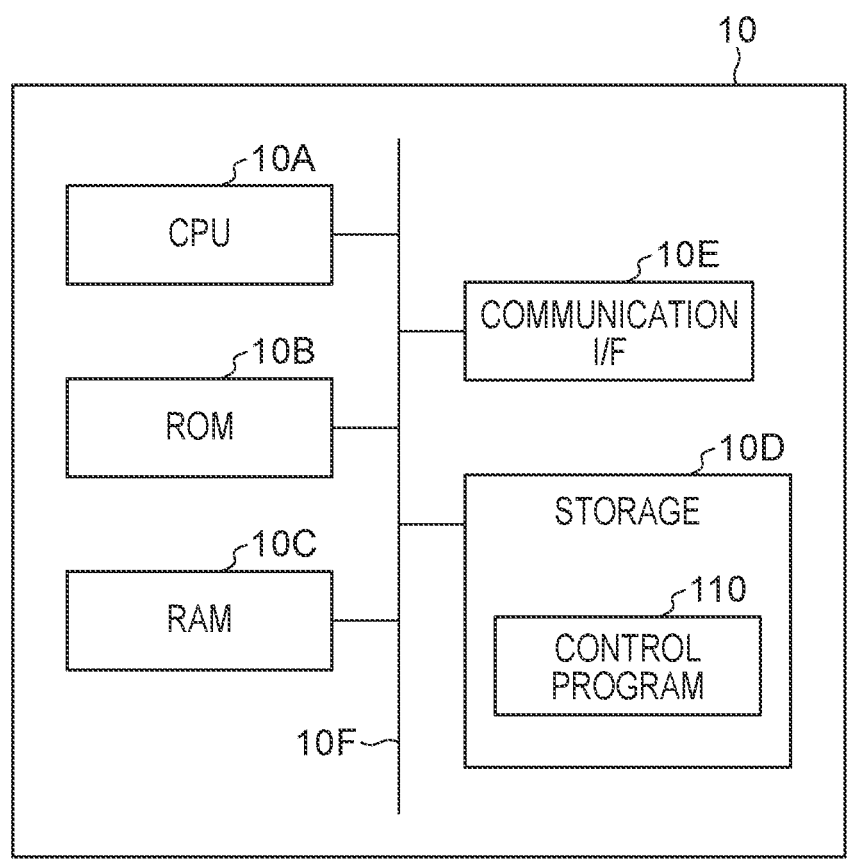
FIG. 2 is a diagram showing an example configuration of a battery control device of the vehicle management system pertaining to the embodiment of the disclosure.

The battery control device 10 is an electronic device in charge of controlling the battery pack 20. The battery control device 10, as shown in FIG. 2, is configured to include a central processing unit (CPU) 10A, a read-only memory (ROM) 10B, a random-access memory (RAM) 10C, a storage 10D, and a communication interface (I/F) 10E. The CPU 10A, the ROM 10B, the RAM 10C, the storage 10D, and the communication I/F 10E are communicably connected to each other via a bus 10F. It will be noted that the CPU 10A is an example of a processor.

The CPU 10A is a central processing unit, executes various types of programs, and controls each part of the battery control device 10. That is, the CPU 10A reads a control program 110 from the storage 10D and executes the program using the RAM 10C as a workspace.

The ROM 10B stores various types of programs and various types of data. The RAM 10C temporarily stores programs or data as a workspace. The storage 10D stores the control program 110.

The communication I/F 10E is an interface for connecting to other devices. The interface uses a communication standard based on CAN or Ethernet (registered trademark), for example.

The battery control device 10 realizes the functions of a storage unit 11, a fault detection unit 12, and an operation control unit 13 described later as a result of the CPU 10A reading and executing the control program 110 stored in the storage 10D.

The storage unit 11 stores, as information relating to the battery pack 20 that can be connected to the battery control device 10, the identification information, the IG-ON total time, and a fault detection result.

The identification information is information used in a comparison process that determines whether or not the battery pack 20 connected to the battery control device 10 is a predetermined regular battery pack.

The IG-ON total time is updated each time the IG-ON total time in the storage unit 25 is written by the operation control unit 13.

The storage unit 11 is set to output, with 0-V and 5-V signals, the identification information and the IG-ON total time.

The fault detection result is the result of a fault detection process performed by the fault detection unit 12 described later. The fault detection result is updated each time the fault detection process is performed by the fault detection unit 12.

The fault detection unit 12 controls the multiplexer 26 to switch the object that can communicate with the battery monitoring integrated circuit 28 to the current sensor 24 when the ignition switch of the vehicle is switched on. Furthermore, the fault detection unit 12 sequentially performs acquisition of the voltage values of some of the cells of the battery 21 from the voltage sensor 23 via the battery monitoring integrated circuit 28, acquisition of the current value from the current sensor 24 via the battery monitoring integrated circuit 28 and the multiplexer 26, and acquisition of the voltage values of the remaining cells from the voltage sensor 23 via the battery monitoring integrated circuit 28. The fault detection unit 12 detects the faulty state of each cell of the battery 21.

Furthermore, the current sensor 24 is configured so that the voltage level of the signal representing the current value acquired from the current sensor 24 falls within a normal range (0 V to 3 V). Furthermore, in a case where the level of the signal representing the current value acquired from the current sensor 24 is outside the normal range, the fault detection unit 12 detects that the multiplexer 26 is faulty because the signal is a signal acquired from the storage unit 25.

The fault detection unit 12 controls the multiplexer 26 to switch the object that can communicate with the battery monitoring integrated circuit 28 to the storage unit 25 when the ignition switch of the vehicle is switched off. Furthermore, the fault detection unit 12 reads the identification information and the TG-ON total time from the storage unit 25 via the battery monitoring integrated circuit 28 and the multiplexer 26 and implements the comparison process to determine whether or not they match the identification information and the IG-ON total time stored in the storage unit 11.

In a case where the identification information read from the storage unit 25 of the battery pack 20 and the identification information stored in the storage unit 11 do not match, the fault detection unit 12 detects that the storage unit 25 is faulty. Furthermore, in a case where the IG-ON total time read from the storage unit 25 of the battery pack 20 and the IG-ON total time stored in the storage unit 11 do not match, the fault detection unit 12 detects that the storage unit 25 is faulty.

Normally, if the battery pack 20 continues to be used without being replaced, the operating time of the power supply system of the vehicle is added, so the IG-ON total time invariably increases from its previous value. However, if at a certain point in time the storage unit 25 becomes faulty and the IG-ON total time in the storage unit 25 is not updated, the IG-ON total time read from the storage unit 25 of the battery pack 20 and the IG-ON total time stored in the storage unit 11 no longer match.

The operation control unit 13 switches the speed of communication with the battery management device 22 between when it reads the information from the storage unit 25 via the battery monitoring integrated circuit 28 and the multiplexer 26 and when it acquires the current value from the current sensor 24 via the battery monitoring integrated circuit 28 and the multiplexer 26.

For example, the communication speed of the battery monitoring integrated circuit 28 is 1000 Kbps and the communication speed of the storage unit 25 is 800 Kbps, so the operation control unit 13 switches the speed of communication with the battery management device 22 to 800 Kbps when the ignition switch is switched off and it reads the information from the storage unit 25. Furthermore, the operation control unit 13 switches the speed of communication with the battery management device 22 to 1000 Kbps when the ignition switch is switched on and it acquires the current value from the current sensor 24.

(Processes)

Figure 3:
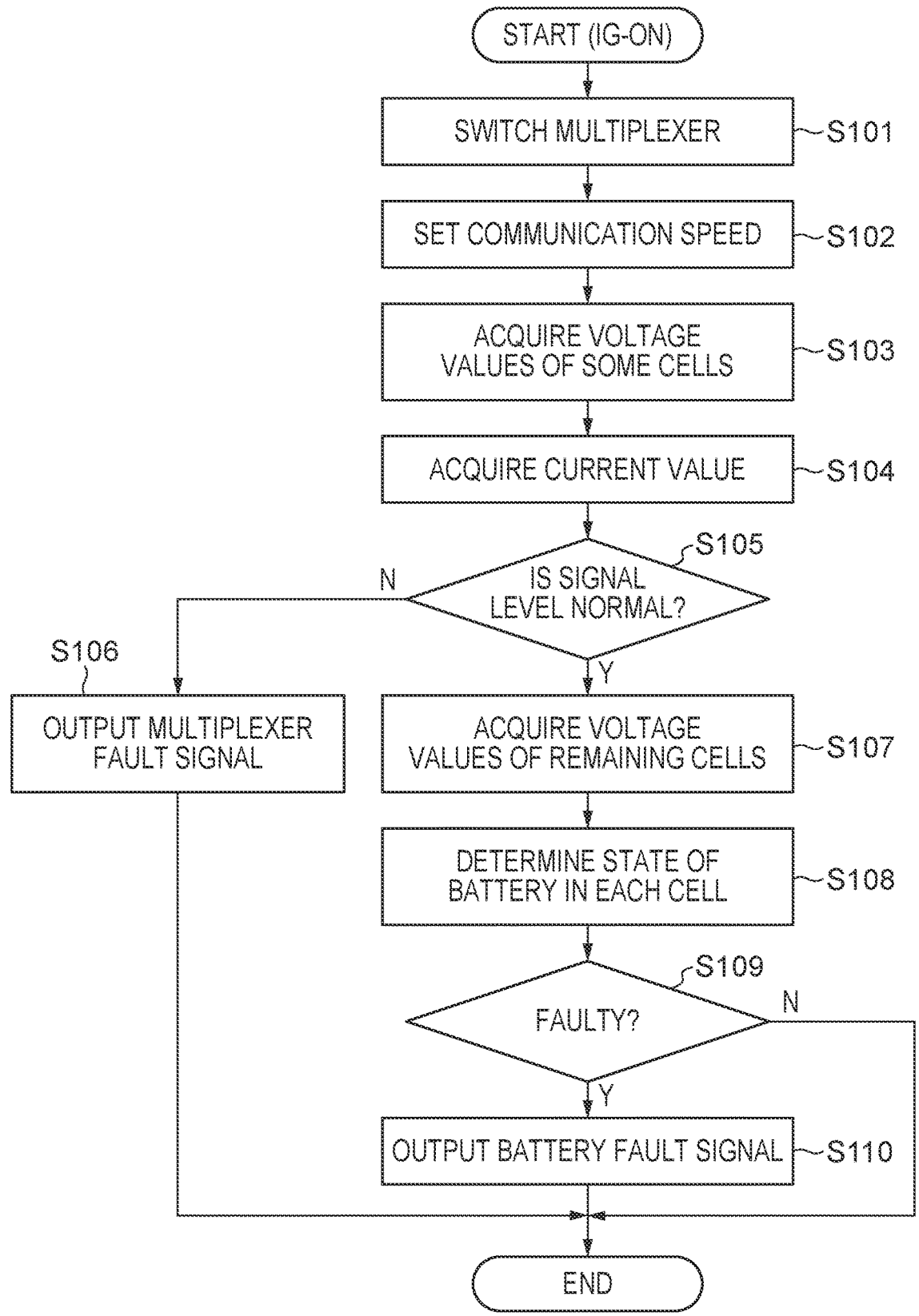

FIG. 3 is a flowchart describing a process performed by the battery control device 10 and started when the ignition switch of the vehicle is switched on. The content of the process will be described with reference to FIG. 3.

First, in step S101 the fault detection unit 12 controls the multiplexer 26 to switch the object that can communicate with the battery monitoring integrated circuit 28 to the current sensor 24.

In step S102 the operation control unit 13 switches the speed of communication with the battery management device 22 to a communication speed (e.g., 1000 Kbps) for acquiring the current value from the current sensor 24.

In step S103 the fault detection unit 12 acquires the voltage values of some of the cells of the battery 21 from the voltage sensor 23 via the battery monitoring integrated circuit 28.

In step S104 the fault detection unit 12 acquires the signal representing the current value from the current sensor 24 via the battery monitoring integrated circuit 28 and the multiplexer 26.

In step S105 the fault detection unit 12 determines whether or not the voltage level of the signal acquired in step S104 is within the normal range. In a case where the voltage level of the signal acquired in step S104 is within the normal range (0 V to 3 V), the fault detection unit 12 moves to step S107. In a case where the voltage level of the signal acquired in step S104 is outside the normal range (0 V to 3 V), the fault detection unit 12 moves to step S106 because the signal is a signal acquired from the storage unit 25.

In step S106 the fault detection unit 12 outputs a multiplexer fault signal indicating that the multiplexer 26 is faulty, stores the fact that the multiplexer 26 is faulty in the storage unit 11, and ends the process.

In step S107 the fault detection unit 12 acquires the voltage values of the remaining cells from the voltage sensor 23 via the battery monitoring integrated circuit 28.

In step S108 the fault detection unit 12 detects the faulty state of each cell of the battery 21 based on the voltage values acquired in steps S103 and S107 and the current value acquired in step S104.

In step S109 the fault detection unit 12 determines whether or not it has been detected that at least one of the cells of the battery 21 is faulty. In a case where it has been detected that at least one of the cells of the battery 21 is faulty, in step S110 the fault detection unit 12 outputs a battery fault signal indicating that the battery 21 is faulty, stores the fact that the battery 21 is faulty in the storage unit 11, and ends the process. In a case where it has not been detected that at least one of the cells of the battery 21 is faulty, the fault detection unit 12 ends the process.

Figure 4:
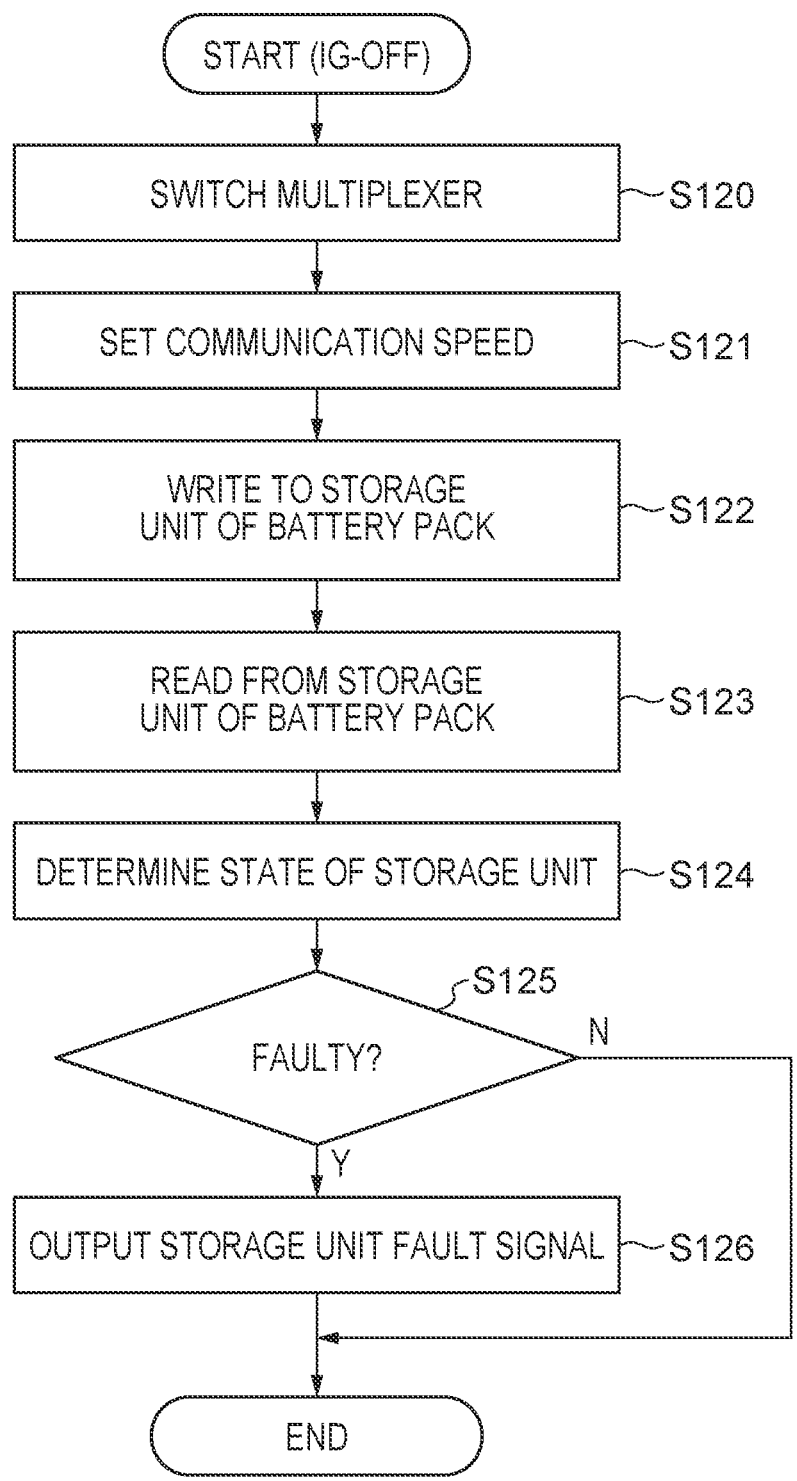
FIG. 4 is a flowchart showing a process when the ignition switch pertaining to the embodiment of the disclosure is switched off.

FIG. 4 is a flowchart describing a process performed by the battery control device 10 and started when the ignition switch of the vehicle is switched off. The content of the process will be described with reference to FIG. 4.

First, in step S120 the fault detection unit 12 controls the multiplexer 26 to switch the object that can communicate with the battery monitoring integrated circuit 28 to the storage unit 25.

In step S121 the operation control unit 13 switches the speed of communication with the battery management device 22 to a communication speed (e.g., 800 Kbps) for reading the information from the storage unit 25.

In step S122 the operation control unit 13 writes the updated IG-ON total time to the storage unit 25 of the battery pack 20 via the battery monitoring integrated circuit 28 and the multiplexer 26 and stores the updated IG-ON total time in the storage unit 11.

In step S123 the fault detection unit 12 reads the identification information and the IG-ON total time from the storage unit 25 via the battery monitoring integrated circuit 28 and the multiplexer 26.

In step S124 the fault detection unit 12 compares the identification information and the TG-ON total time read in step S123 with the identification information and the TG-ON total time stored in the storage unit 11 to detect the faulty state of the storage unit 25 of the battery pack 20. For example, in a case where the identification information read in step S123 and the identification information stored in the storage unit 11 do not match, or in a case where the IG-ON total time read in step S123 and the IG-ON total time stored in the storage unit 11 do not match, the fault detection unit 12 detects that the storage unit 25 of the battery pack 20 is faulty.

In step S125 the fault detection unit 12 determines whether or not it has been detected that the storage unit 25 of the battery pack 20 is faulty. In a case where it has been detected that the storage unit 25 of the battery pack 20 is faulty, in step S126 the fault detection unit 12 outputs a storage unit fault signal indicating that the storage unit 25 of the battery pack 20 is faulty, stores the fact that the storage unit 25 of the battery pack 20 is faulty in the storage unit 11, and ends the process. In a case where it has not been detected that the storage unit 25 of the battery pack 20 is faulty, the fault detection unit 12 ends the process.

SUMMARY

In the vehicle management system of this embodiment, the voltage value and the current value can be acquired with one integrated circuit, so the acquisitions of the voltage value and the current value can be synchronized. Furthermore, the time lag between the timing of the acquisition of the voltage value and the timing of the acquisition of the current value can be reduced, so the state of the battery in each cell can be accurately determined.

Furthermore, the information relating to the battery stored in the storage unit of the battery pack can also be acquired with one integrated circuit.

Furthermore, the voltage value and the current value of the battery and the information relating to the battery stored in the storage unit can be acquired while reducing the number of communication lines connected to the battery monitoring integrated circuit.

Furthermore, the connection between the storage unit of the battery pack and the battery control device is used to identify the type of the battery, so it is not necessary for the storage unit of the battery pack to always be connected to the battery control device. Thus, in this embodiment, by connecting the storage unit of the battery pack and the current sensor to the battery monitoring integrated circuit via the multiplexer, the limited number of terminals of the battery monitoring integrated circuit can be efficiently used.

Furthermore, the faulty state of the multiplexer is detected without increasing the number of ports of the multiplexer.

Furthermore, in the battery pack, the multiplexer is used to switch between the current value and the information in the storage unit. Furthermore, by separating the timings when the current value and the information in the storage unit are acquired, fault detection can be performed with a few number of terminals.

Furthermore, the storage unit that stores the information relating to the battery is provided in the battery pack, and the battery control device reads data from and writes data to the storage unit of the battery pack. At this time, by using the communication path that is used when acquiring the current value to read data from and write data to the storage unit in the battery pack, the number of communication lines between the battery pack and the battery control device can be reduced.

Furthermore, even when the communication speed when reading the information from the storage unit of the battery pack and the communication speed when acquiring the current value from the current sensor are different, this can be handled.

[Remarks]

It will be noted that the multiplexer 26 may also be configured to be able to switch the object that can communicate with the battery monitoring integrated circuit 28 to either one of the temperature sensor 27 and the storage unit 25.

The processes that the CPU executed by reading software (a program) in the above embodiment may also be executed by various types of processors other than a CPU. Examples of processors in this case include programmable logic devices (PLDs) whose circuit configuration can be changed after manufacture, such as field-programmable gate arrays (FPGAs), and dedicated electrical circuits that are processors having a circuit configuration dedicatedly designed for executing specific processes, such as application-specific integrated circuits (ASICs). Furthermore, the processes may be executed by one of these various types of processors or may be executed by a combination of two or more processors of the same type or different types (e.g., plural FPGAs, and a combination of a CPU and an FPGA, etc.). Furthermore, the hardware structures of these various types of processors are more specifically electrical circuits in which circuit elements such as semiconductor elements are combined.

Furthermore, in the above embodiment, the program was described as being stored (installed) beforehand in a computer-readable non-transitory recording medium. For example, in the ECU, the program is stored beforehand in the ROM. However, the program is not limited to this and may also be stored in a storage such as a hard disk drive (HDD) and an SSD. Furthermore, the program may also be provided in a form in which it is recorded in a non-transitory recording medium such as a compact disc read-only memory (CD-ROM), a digital versatile disc read-only memory (DVD-ROM), and a universal serial bus (USB) memory.

Furthermore, the program may also take a form in which it is downloaded via a network from an external device.

The process flows described in the above embodiment are also examples, and unnecessary steps may be deleted, new steps may be added, and process orders may be changed in a range that does not depart from the spirit of the disclosure.

What is claimed is:

1. A vehicle management system, comprising:
an external control device; and
a management device installed to a vehicle, provided in a casing that houses a battery, and manages the battery, the management device including:
  a voltage sensor that detects a voltage value of the battery,
  a current sensor that detects a current value of the battery,
  an integrated circuit that is communicably connected to the voltage sensor and to the current sensor, the integrated circuit outputting to the external control device a signal representing the voltage value acquired from the voltage sensor and a signal representing the current value acquired from the current sensor,
  a storage unit that is communicably connected to the integrated circuit and stores information relating to the battery, and
  a multiplexer that is connected to the current sensor, the storage unit, and the integrated circuit and switches an object that communicates with the integrated circuit to either the current sensor or the storage unit,
wherein the storage unit is communicably connected, via the integrated circuit, to the external control device,
wherein the multiplexer switches the object that communicates with the integrated circuit to the current sensor in a case in which an ignition switch of the vehicle is switched on, and switches the object that communicates with the integrated circuit to the storage unit in a case in which the ignition switch of the vehicle is switched off,
wherein the external control device includes a memory and a processor coupled to the memory, and
wherein the processor is configured to switch a speed of communication with the management device between a time at which the processor reads the information from the storage unit via the integrated circuit and the multiplexer and a time at which the processor acquires the current value from the current sensor via the integrated circuit and the multiplexer.

2. The vehicle management system of claim 1, the processor is further configured to detect a state of the multiplexer based on a signal that is output via the multiplexer and the integrated circuit in a case in which the ignition switch of the vehicle is switched on.

3. A non-transitory recording medium in which is recorded a program causing a computer to function as the external control device in the vehicle management system of claim 2.

4. The vehicle management system of claim 1, wherein:
the battery includes plural cells, and
the processor is further configured to sequentially perform acquisition of voltage values of some of the cells from the voltage sensor, acquisition of the current value from the current sensor, and acquisition of voltage values of the remaining cells from the voltage sensor, to determine a state of the battery in each cell.

5. A non-transitory recording medium in which is recorded a program causing a computer to function as the external control device in the vehicle management system of claim 4.

6. A vehicle management method in the vehicle management system of claim 1,
wherein the external control device detects a state of the multiplexer based on a signal that is output via the multiplexer and the integrated circuit in a case in which the ignition switch of the vehicle is switched on.

7. A vehicle management method in the vehicle management system of claim 1, with the battery including plural cells,
wherein the external control device sequentially performs acquisition of voltage values of some of the cells from the voltage sensor, acquisition of the current value from the current sensor, and acquisition of voltage values of the remaining cells from the voltage sensor, to determine a state of the battery in each cell.

8. A non-transitory recording medium in which is recorded a program causing a computer to function as the external control device in the vehicle management system of claim 1.

9. A vehicle management system, comprising:
an external control device; and
a management device installed to a vehicle, provided in a casing that houses a battery, and manages the battery, the management device including
   a voltage sensor that detects a voltage value of the battery,
   a current sensor that detects a current value of the battery,
   an integrated circuit that is communicably connected to the voltage sensor and to the current sensor, the integrated circuit outputting to the external control device a signal representing the voltage value acquired from the voltage sensor and a signal representing the current value acquired from the current sensor,
   a storage unit that is communicably connected to the integrated circuit and stores information relating to the battery, and
   a multiplexer that is connected to the current sensor, the storage unit, and the integrated circuit and switches an object that communicates with the integrated circuit to either the current sensor or the storage unit,
wherein the storage unit is communicably connected, via the integrated circuit, to the external control device,
wherein the multiplexer switches the object that communicates with the integrated circuit to the current sensor in a case in which an ignition switch of the vehicle is switched on, and switches the object that communicates with the integrated circuit to the storage unit in a case in which the ignition switch of the vehicle is switched off, and
wherein the external control device switches a speed of communication with the management device between a time at which the external control device reads the information from the storage unit via the integrated circuit and the multiplexer and a time at which the external control device acquires the current value from the current sensor via the integrated circuit and the multiplexer.

* * * * *